(12) United States Patent
Henmi et al.

(10) Patent No.: US 10,746,812 B2
(45) Date of Patent: Aug. 18, 2020

(54) SEMICONDUCTOR DEVICE, ELECTRONIC CIRCUIT, AND METHOD OF INSPECTING SEMICONDUCTOR DEVICE

(71) Applicant: RENESAS ELECTRONICS CORPORATION, Tokyo (JP)

(72) Inventors: Kazuo Henmi, Tokyo (JP); Ken Katano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/534,522

(22) Filed: Aug. 7, 2019

(65) Prior Publication Data
US 2020/0072891 A1   Mar. 5, 2020

(30) Foreign Application Priority Data
Aug. 28, 2018   (JP) .................................. 2018-158939

(51) Int. Cl.
*G01R 31/70* (2020.01)
*H03F 3/45* (2006.01)

(52) U.S. Cl.
CPC ......... *G01R 31/70* (2020.01); *H03F 3/45269* (2013.01); *H03F 3/45273* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,100,710 | A * | 8/2000 | Monnot | G01R 31/2853 257/E23.079 |
| 9,077,171 | B2 * | 7/2015 | Givelin | G01R 31/2853 |
| 9,176,191 | B2 * | 11/2015 | Rossi | G01R 31/3187 |
| 9,726,709 | B2 * | 8/2017 | Kajiyama | G01R 31/66 |
| 10,330,719 | B2 * | 6/2019 | Durston | G01D 18/00 |
| 2009/0091306 | A1 * | 4/2009 | Hojo | H01L 27/0823 323/273 |

(Continued)

FOREIGN PATENT DOCUMENTS

| | | | | |
|---|---|---|---|---|
| JP | 2007-165368 A | | 6/2007 | |
| JP | 2007165368 A | * | 6/2007 | ............. H01L 24/78 |

(Continued)

*Primary Examiner* — Adam D Houston
(74) *Attorney, Agent, or Firm* — McDermott Will & Emery LLP

(57) ABSTRACT

A semiconductor device includes a semiconductor chip having first, second and third pads, first and second external terminals to which a power supply potential or a reference potential is supplied, first and second wires connecting the first and second external terminals and the first and second pads, and a third wire connecting the second external terminal and the third pad. The semiconductor chip further includes a first internal wiring connected to the first and second pads, a second internal wiring connected to the third pad, and a detection circuit. The detection circuit includes: a current source for passing a current through the first and second internal wirings; first and second resistive elements connected between the current source and the first and second internal wirings; and an amplifier circuit for amplifying a relative potential difference generated between the first and second resistive elements and outputting a detection signal.

17 Claims, 12 Drawing Sheets

(56) References Cited

U.S. PATENT DOCUMENTS

| | | | |
|---|---|---|---|
| 2010/0045328 A1* | 2/2010 | Suto | G01R 31/70 |
| | | | 324/754.01 |
| 2014/0338449 A1* | 11/2014 | Durston | G01C 19/5684 |
| | | | 73/504.12 |
| 2016/0231373 A1* | 8/2016 | Kajiyama | G01R 31/2856 |
| 2020/0072891 A1* | 3/2020 | Henmi | H03F 3/45269 |

FOREIGN PATENT DOCUMENTS

| | | | | |
|---|---|---|---|---|
| JP | 2012-L33540 | * | 2/2011 | G01R 31/28 |
| JP | 2013-S75789 | * | 10/2013 | H01L 27/04 |
| JP | 2016-145720 A | | 8/2016 | |

* cited by examiner

SEMICONDUCTOR DEVICE, ELECTRONIC CIRCUIT, AND METHOD OF INSPECTING SEMICONDUCTOR DEVICE

CROSS-REFERENCE TO RELATED APPLICATIONS

The disclosure of Japanese Patent Application No. 2018-158939 filed on Aug. 28, 2018 including the specification, drawings and abstract is incorporated herein by reference in its entirety.

BACKGROUND

The present disclosure relates to a semiconductor device, and can be applied to, for example, a semiconductor device in which multi-bonding is performed.

The electrode pads provided on the semiconductor chip are wire-bonded to lead terminals via wires. The lead terminal supplies a power supply voltage to a circuit formed in the semiconductor chip through a wire, inputs/outputs a signal, or receives an output voltage of the circuit in the semiconductor chip. In some cases, a plurality of electrode pads are provided on a semiconductor chip, and the respective electrode pads are wire-bonded to the same lead terminal (also referred to as multi-bonding).

Prior art documents of multi-bonding include Japanese Patent Laid-Open Publication JP2016-145720 (Patent Document 1) and JP2007-165368 (Patent Document 2).

SUMMARY

Even in the case where only a part of the wires in one external terminal (e.g., ground terminal) to which a plurality of wires are connected becomes disconnected (open state such as cutting of the wire itself, isolation of the external terminal and the wire, separation of the electrode pad and the wire, etc.), the electrical connection of another wire is maintained, and therefore, the disconnection cannot be directly detected in terms of function and characteristics.

Other objects and novel features will become apparent from the description of the present disclosure and the accompanying drawings.

The typical aspects of the present disclosure will be briefly described below.

That is, the semiconductor device includes a detection circuit that causes a predetermined current to flow through each of the connection lines connected to the two power supply potentials or the reference potential, amplifies the difference between the voltages of the two connection lines, and outputs the amplified difference.

According to the semiconductor device, the open state can be detected.

DETAILED DESCRIPTION

Figure 1:
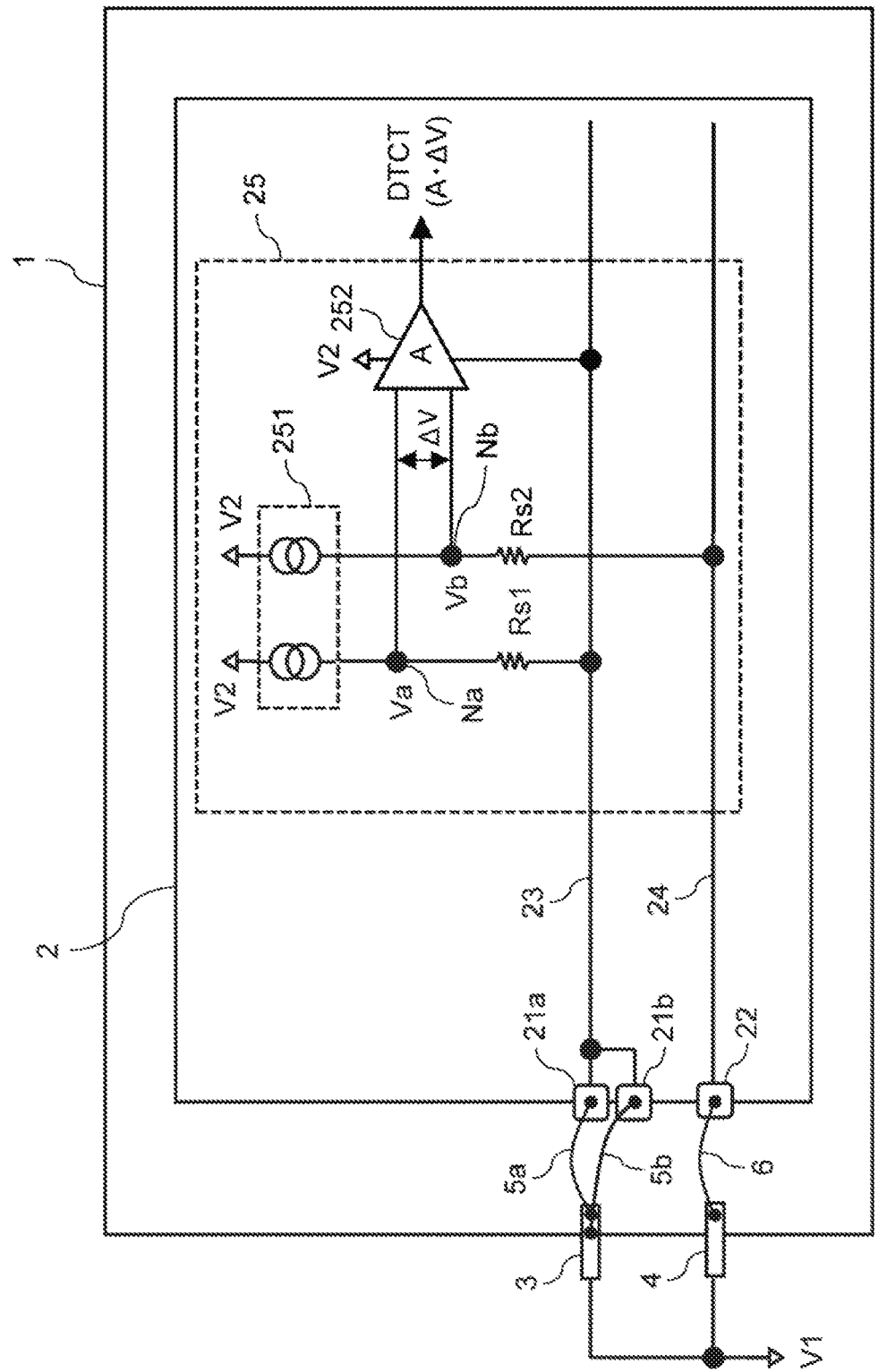
FIG. 1 is a diagram showing a configuration of a semiconductor device according to an embodiment.

Embodiments, examples, and modified examples will be described below with reference to the drawings. However, in the following description, the same components are denoted by the same reference numerals, and a repetitive description thereof may be omitted.

First, the semiconductor device of the embodiment will be described with reference to FIG. 1. FIG. 1 is a diagram showing a configuration of a semiconductor device according to an embodiment.

The semiconductor device 1 includes a semiconductor chip 2 having a first pad 21a, a second pad 21b, and a third pad 22, a first external terminal 3, a second external terminal 4, a first wire 5a connecting the first external terminal 3 and the first pad 21a, a second wire 5b connecting the first external terminal 3 and the second pad 21b, and a third wire 6 connecting the second external terminal 4 and the third pad 22.

The semiconductor chip 2 further includes a first internal wiring 23 connected to the first pad 21a and the second pad 21b, a second internal wiring 24 connected to the third pad 22, and a detection circuit 25. The detection circuit 25 includes a current source 251 for passing a current through the first internal wiring 23 and the second internal wiring 24, a first resistive element Rs1 connected between the current source 251 and the first internal wiring 23, a second resistive element Rs2 connected between the current source 251 and the second internal wiring 24, and an amplifier circuit 252 for amplifying a relative potential difference ($\Delta V = Va - Vb$) generated between the first resistive element Rs1 and the second resistive element Rs2 and outputting a detection signal (DTCT).

A first potential (V1) is supplied to the first external terminal 3 and the second external terminal 4, and a second potential (V2) is supplied to the current source 251. For example, the first external terminal 3 and the second external terminal 4 are supplied with a reference potential (V1=0) at an external terminal for grounding, and a power supply potential (V2) is supplied to the current source 251. Here, the power supply potential may be a positive potential or a negative potential. Thus, V2>V1=0, or V2<V1=0.

The first external terminal 3 and the second external terminal 4 are supplied with a power supply potential (V1) at an external terminal for power supply, and a grounding potential (V2) may be supplied to the current source 251. Here, the power supply potential may be a positive potential or a negative potential. Thus, V1>V2=0, or V2<V1=0.

In addition, the first external terminal 3 and the second external terminal 4 are supplied with a positive potential power supply potential (V1) at an external terminal for power supply, and the negative potential power supply potential (V2) may be supplied to the current source 251. Thus, V1>0>V2.

In addition, the first external terminal 3 and the second external terminal 4 are supplied with a power supply potential (V1) having a negative positive potential at the external terminal for the power supply, and a positive potential power supply potential (V2) may be supplied to the current source 251. Thus, V2>0>V1.

According to the embodiment, even if any one of the first wire 5a and the second wire 5b connected to the first external terminal 3 in the semiconductor device 1 is disconnected, the semiconductor device 1 can detect the disconnection failure from the change in the potential difference caused by the change in the resistivity of the first wire 5b and the second wire 5a. That is, open faults such as cutting of the first wire 5a or the second wire 5b itself, separation of the first external terminal 3 and the first wire 5a or the second wire 5b, separation of the first pad 21a and the first wire 5a, separation of the second pad 21b and the second wire 5b, and the like can be detected.

Hereinafter, the first external terminal 3 and the second external terminal 4 are provided with a reference potential (V1=0) at an external terminal for grounding, and a positive potential power supply potential (V2) is supplied to the current source 251.

EMBODIMENT

Figure 2:
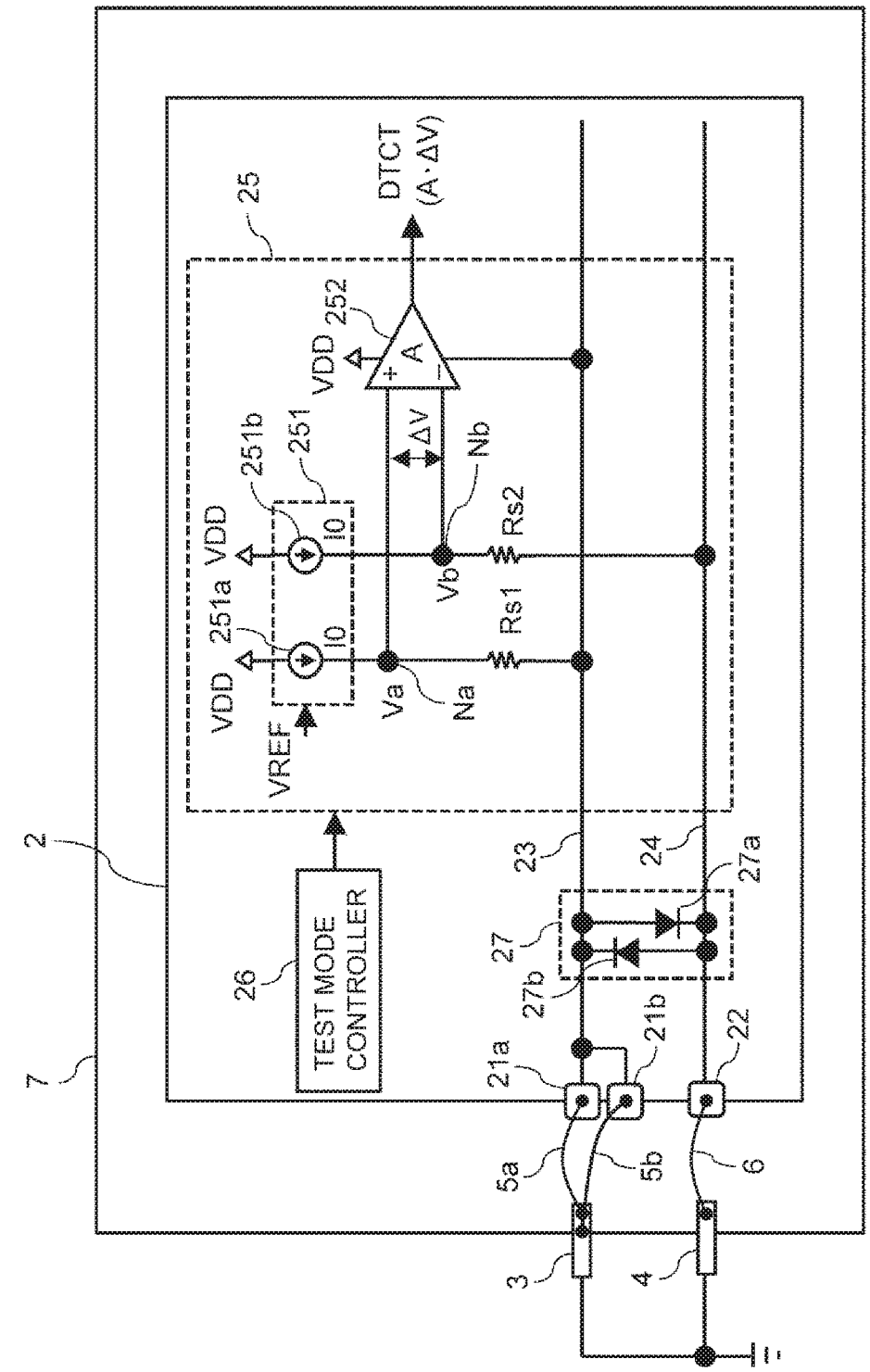
FIG. 2 is a diagram showing the configuration of the semiconductor device of the embodiment.
Figure 3:
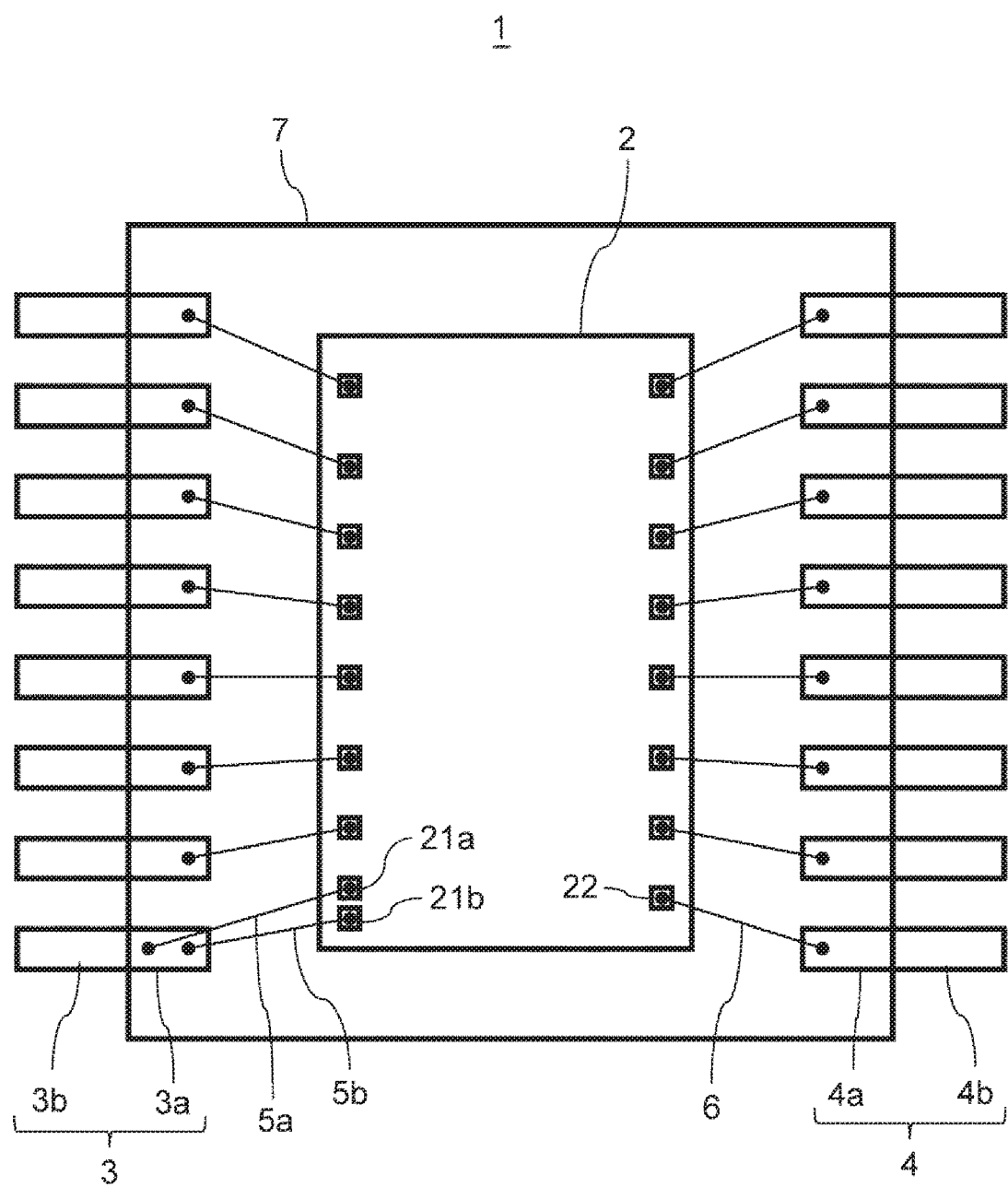
FIG. 3 is a diagram showing a relationship among a semiconductor chip mounted on a sealing body, wires, and external terminals.

Next, the semiconductor device of the embodiment will be described with reference to FIGS. 2 and 3. FIG. 2 is a diagram showing the configuration of the semiconductor device of the embodiment. FIG. 3 is a diagram showing a relationship among a semiconductor chip mounted on a sealing body, wires, and external terminals.

Semiconductor device 1 is an on-board ASIC for configuring a system in conjunction with a microcontroller (hereinafter referred to as a "MCU") for example.

As shown in FIG. 2, the semiconductor device 1 of the embodiment includes a semiconductor chip 2, a first external terminal 3 to which a grounding potential is supplied, a second external terminal 4 to which a grounding potential is supplied, a first wire 5a, a second wire 5b, and a third wire 6, and an sealing member 7 that seals these. The semiconductor chip 2 has a first pad 21a, a second pad 21b, and a third pad 22. The first wire 5a is a bonding wire for connecting the first external terminal 3 and the first pads 21a. The second wire 5b is a bonding wire for connecting the first external terminal 3 and the second pads 21b. The third wire 6 is a bonding wire for connecting the second external terminal 4 and the third pad 22. The bonding wire is, for example, a thin metal wire of gold, aluminum, copper, or the like.

As shown in FIG. 3, the semiconductor device 1 includes, in addition to the first external terminal 3 and the second external terminal 4, an external terminal to which a power supply voltage is supplied and an external terminal to which a signal is input and/or output, and the semiconductor chip 2 includes a pad connected by a bonding wire to an external terminal to which a power supply voltage is supplied and a pad connected by a bonding wire to an external terminal to which a signal is input and/or output.

For example, the semiconductor chip 2 is mounted on a die pad (not shown) of a lead frame, the first external terminal 3 includes an inner lead 3a and an outer lead 3b of the lead frame, and the second external terminal 4 includes an inner lead 4a and an outer lead 4b of the lead frame. The inner leads 3a and 4a are located inside the sealing member 7, and the first wire 5a, the second wire 5b, and the third wire 6 are connected to each other. The outer lead 3b,4b is located on the outer side of the sealing member 7, and is connected to external wirings provided on a printed circuit board or the like by solder or the like. The sealing member 7 is, for example, resin, that is, the semiconductor chip 2 and the like are resin-sealed.

As shown in FIG. 2, the semiconductor chip 2 further includes a first internal wiring 23, a second internal wiring 24, a detection circuit 25, and a test mode control circuit (TEST MODE CONTROLLER) 26 that enables the operation of the detection circuit 25 only during testing. The first internal wiring 23 and the second internal wiring 24 are formed of a metal film such as aluminum or copper. The impedance, in particular the wiring resistance, of the wiring or the like from the first external terminal 3 and the second external terminal 4 to the internal integrated circuit via the first internal wiring 23 and the second internal wiring 24 is small, for example, less than 1Ω.

The detection circuit 25 includes a current source 251 for passing a current through the first internal wiring 23 and the second internal wiring 24 in the detection circuit 25, a first resistive element Rs1 and a second resistive element Rs2 connected to the current source 251, and an amplifier circuit 252 for outputting a voltage (A·ΔV) obtained by amplifying a relative potential difference (ΔV) generated between the first resistive element Rs1 and the second resistive element Rs2 by a factor of A as a detection signal (DTCT). The current source 251 is a current mirror current source that generates a current based on a reference voltage VREF, and includes a first current source 251a and a second current source 251b.

The test mode control circuit 26 is set to, for example, an operation mode (test mode) for diagnosing the presence or absence of a wire failure by a control signal from the outside of the semiconductor device 1, and enables the operation of the detection circuit 25 only in the test mode, and disables the operation of the circuits other than the detection circuit 25.

Figure 4:
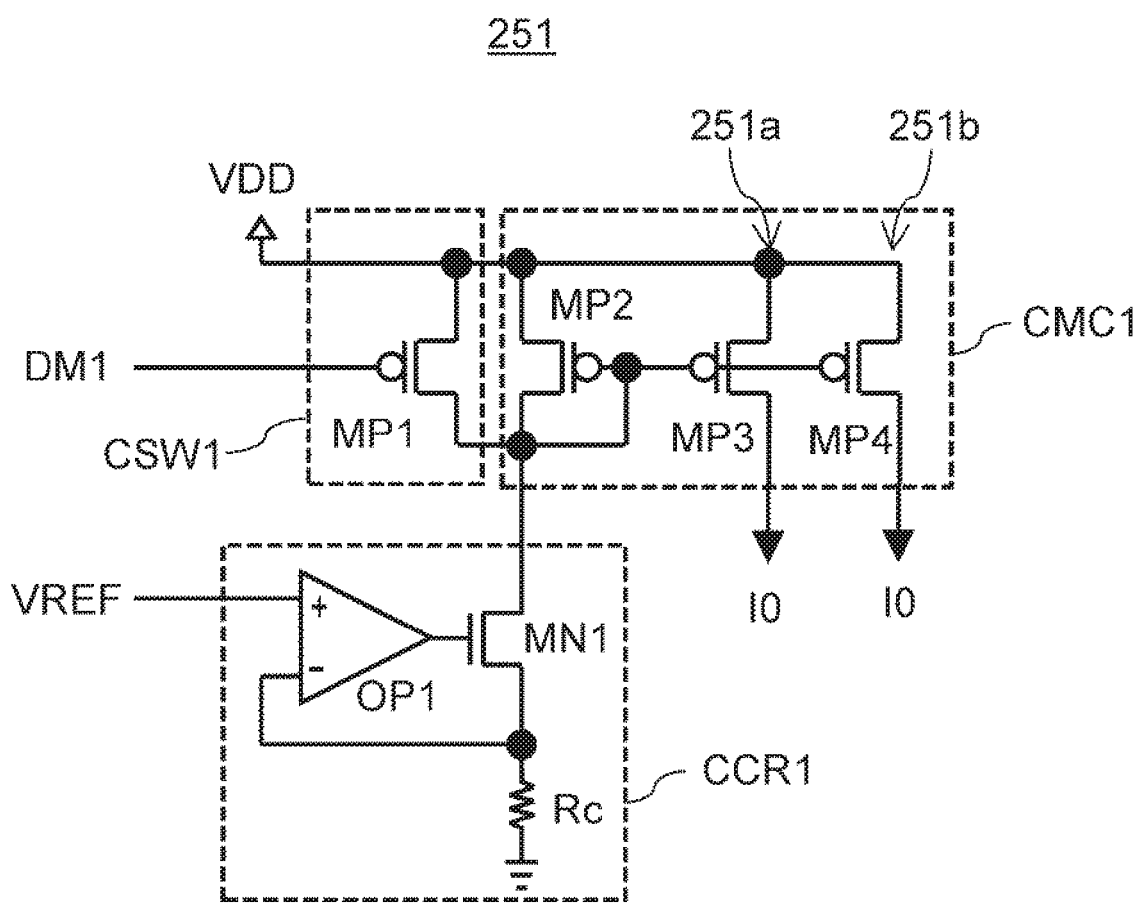
FIG. 4 is a circuit diagram showing a configuration of the current source of FIG. 2.
Figure 5:
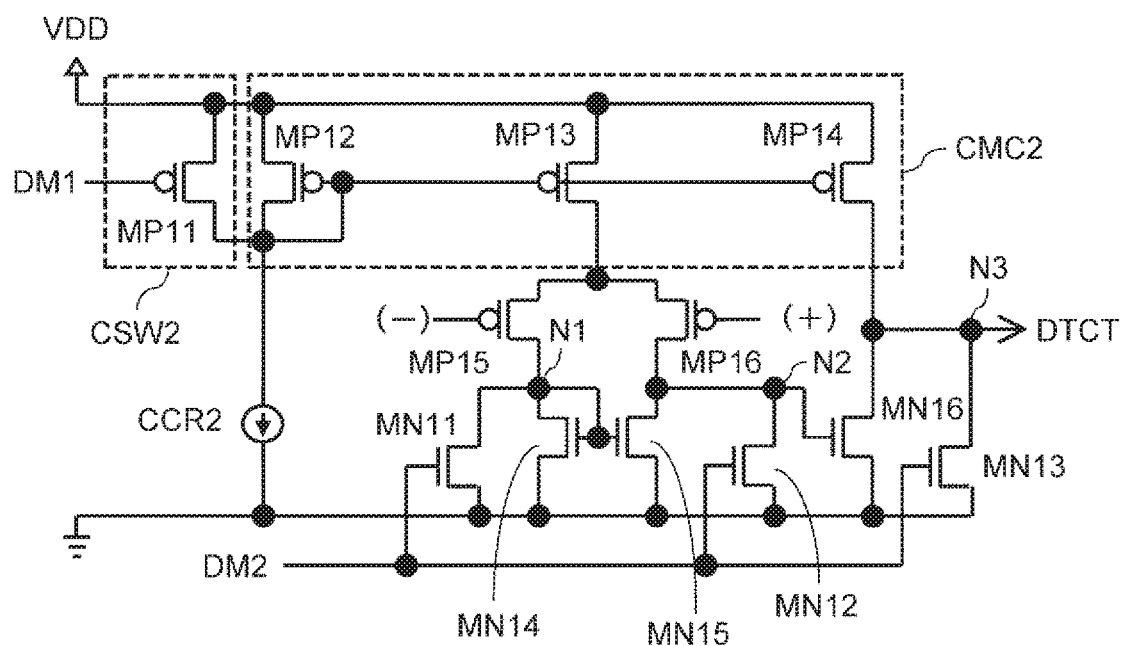
FIG. 5 is a circuit diagram showing a configuration of the amplifier circuit of FIG. 2.

Next, the details of the detection circuit 25 will be described with reference to FIGS. 4 and 5. FIG. 4 is a circuit diagram showing a configuration of the current source of FIG. 2. FIG. 5 is a circuit diagram showing a configuration of the amplifier circuit of FIG. 2.

As shown in FIG. 4, the current source 251 includes, for example, a constant current regulator CCR1, a current mirror CMC1, and a switch CSW1. The constant current regulator CCR1 includes an operational amplifier OP1, a resistance element Rc having a resistance value rc, and an N-channel MOS transistor MN1, and generates a constant current (=VREF/rc) based on a reference voltage (VREF). The current mirror CMC1 includes a diode-connected P-channel MOS transistor MP2 and a P-channel MOS transistor MP3, MP4, copies a constant current generated by a constant current regulator CCR1, and outputs a current (I 0) from two channels (P-channel MOS transistor MP3, MP4). The switch CSW1 has a P-channel MOS transistor MP1 provided between the gate of the P-channel MOS transistor MP2, MP3, MP4 of the current mirror circuit CMC1 and the power supply VDD, and controls the ON/OFF of the current mirror circuit CMC1.

In the normal operation, the control signal (DM1) transmitted from the test mode control circuit 26 becomes a low level, and the P-channel MOS transistor MP1 is turned on, so that the voltage between the gate and the source of the P-channel MOS transistor MP2 of the current mirror circuit CMC1 becomes zero, and the current mirror circuit CMC1 is turned off. That is, no current is outputted to the first resistive element Rs1 and the first resistive element Rs2.

In the test-mode operation, the control signal (DM1) becomes a high level, a current (=VREF/rc) flows through the P-channel MOS transistor MP2 in the current mirror circuit CMC1, and the gate-source voltage of the P-channel MOS transistor MP2 increases. As a result, the current mirror CMC1 is turned on (activated), and a current (I 0) copied to an integral multiple of the current flowing through the P-channel MOS transistor MP2 flows through the two output channels (P-channel MOS transistor MP3, MP4). These currents are outputted to the first resistive element Rs1 and the first resistive element Rs2, respectively.

As shown in FIG. 5, the amplifier circuit 252 is a differential amplifier having a current source CCR2, a current mirror circuit CMC2, and the like, and includes a switch CSW2 for controlling the ON/OFF of the current mirror circuit CMC2, an N-channel MOS transistor MN11, MN12 for fixing the inner nodes N1 and N2 of the circuit, and an N-channel MOS transistor MN13 for fixing the output node N3. The P-channel MOS transistor MP15, MP16 and the N-channel MOS transistor MN14, MN15 constitute the core circuits of the differential amplifiers. The non-inverting input terminal (+) to which the first internal node Na is connected is connected to the gate of the P-channel MOS transistor MP16, and the inverting input terminal (−) to which the second internal node Nb is input is connected to the gate of the P-channel MOS transistor MP15. The drain of the N-channel MOS transistor MN16 is outputted as the detection signal (DTCT). The switch CSW2 includes a P-channel MOS transistor MP11 provided between the gates of the P-channel MOS transistors MP12, MP13, MP14 of the current mirror circuit CMC2 and the power supply (VDD).

In the normal operation, the control signal (DM1) outputted from the test mode control circuit 26 becomes a low level, and the P-channel MOS transistor MP11 is turned on, so that the current mirror circuit CMC2 stops and no current flows to the respective portions in the amplifier circuit 252. At this time, the control signal (DM2) becomes high level, and the N-channel type MOS transistor MN11, M12, and MN13 are turned on, and the internal nodes N1 and N2 of the amplification circuit 252 and the output node N3 are lowered to ground potential to turn off the N-channel type MOS transistor MN14, MN15, MN16.

In the test-mode operation, the control signal (DM1) is at a high level and the control signal (DM2) is at a low level, the P-channel MOS transistor MP11 and the N-channel MOS transistors MN11, MN12, and MN13 are turned off, and a current flows through the respective parts in the amplification circuit 252, so that the amplifying operation is normally performed.

In the test mode operation, as described above, the test mode control circuit 26 sets the current source 251 and the amplifier circuit 252 to the on state. As a result, the current (I 0) of the first current source 251a flows to the first external terminal 3 via the first resistive element Rs1, and the current (I 0) of the second current source 251b flows to the second external terminal 4 via the second resistive element Rs2. The impedance on the path, i.e., the resistance value of the first external terminal 3, the resistance value of the first wire 5a, the resistance value of the second wire 5b, the resistance value of the first internal wire 23, and the resistance value of the first resistive element Rs1, and the current (I 0) of the first current source 251a are multiplied to generate a voltage drop, and the potential (Va) of the first internal node Na connected to the first external terminal 3 rises. Further, a voltage drop is generated in which the resistance value of the second external terminal 4, the resistance value of the third wire 6, the resistance value of the second internal wire 24, the resistance value of the second resistive element Rs2, and the current (I 0) of the second current source 251b can be multiplied, and the potential (Vb) of the second internal node Nb connected to the second external terminal 4 rises. The amplification circuit 252 amplifies a potential difference ($\Delta V = Va-Vb$) between Va and Vb, and transmits an analog voltage ($A \cdot \Delta V$) as a detection signal (DTCT). Here, A is the amplification degree of the amplifier circuit 252.

If the resistance value of one wire is r, the resistance value of the wire to the first external terminal 3 increases from r/2 to r when one wire is cut. As a result of this change, the input voltage difference ($\Delta V$) of the amplifier circuit 252 increases by ($r \times I\ 0$)/2. For example, if $r=0.1\Omega$ and I0=1 mA, the increment of $\Delta V$ will be 50 μV.

When either the first wire 5a or the second wire 5b is disconnected, $\Delta V$ increases in the positive direction, and the voltage of the detection signal (DTCT) also increases. The disconnection failure of only one wire can be detected by the voltage change of the detection signal (DTCT).

Figure 6:
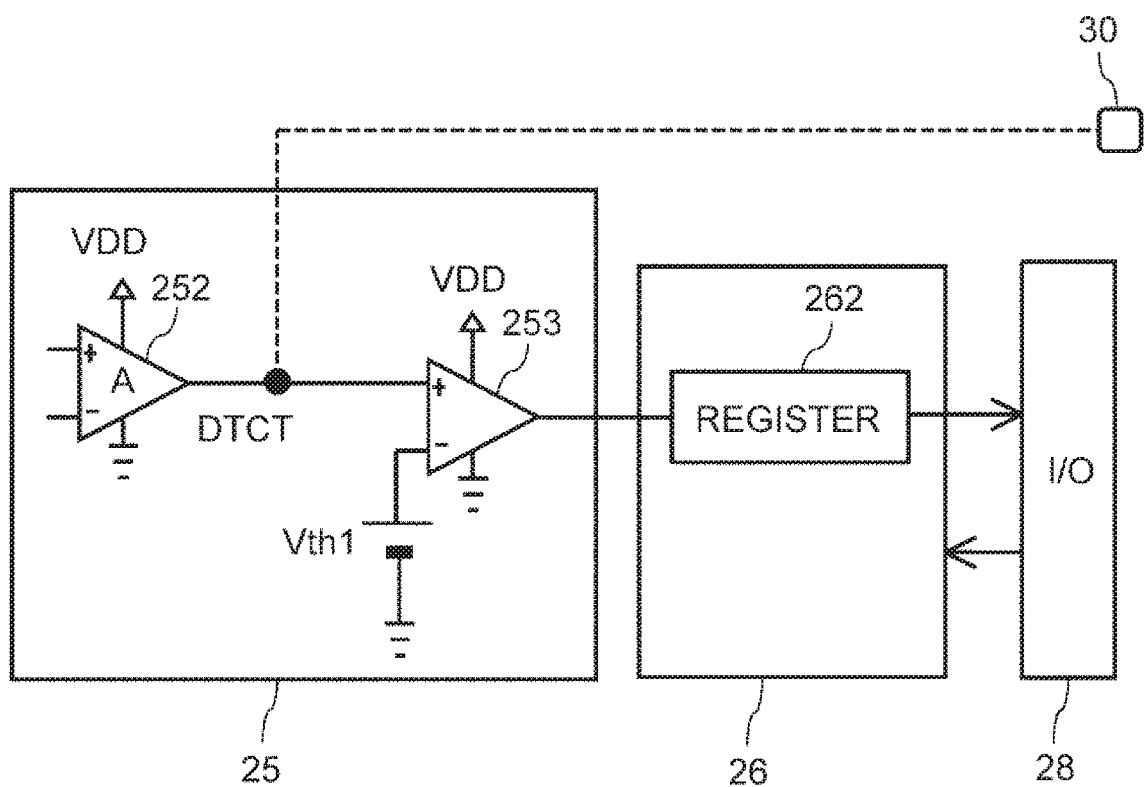
FIG. 6 is a block diagram showing an output destination of the amplifier circuit of FIG. 2.

Next, the detection of the disconnection failure by the detection signals (DTCT) will be described with reference to FIG. 6. FIG. 6 is a block diagram showing an output destination of the amplifier circuit of FIG. 2.

As shown in FIG. 6, the transmitted detection signal (DTCT) is compared with a predetermined threshold voltage (Vth1) by providing a comparator 253 in the detection circuit 25, for example. As a result, it is possible to independently diagnose the presence or absence of wire breakage in the semiconductor device 1. When it is diagnosed as a disconnection, the semiconductor chip 2 may be stopped immediately based on the result of the comparator 253, or a flag indicating the disconnection may be stored in the register 262 in the test mode control circuit 26 and transmitted to the outside of the semiconductor device 1 via the I/O interface 28 such as a serial interface. In this case, it is input to an external device of the semiconductor device 1, for example, the MCU, and the operating state of the semiconductor device 1 can be controlled by the MCU. The control signal from the MCU is input to the test mode control circuit 26 via the I/O interface 28, and the test mode control circuit 26 controls the operation of the semiconductor device 1. For the trimming described later, the detection signal (DTCT) can be output to the outside of the semiconductor device 1 through the output pads 30. Therefore, in the final operation confirmation process before shipment of the semiconductor device 1, it is possible to check the presence or absence of disconnection of the wire by the tester.

Next, detection of a disconnection fault different from the above will be described.

As shown in FIG. 2, the first diode 27a and the second diode 27b are connected in opposite directions between the first internal wiring 23 connected to the first external terminal 3 and the second internal wiring 24 connected to the second external terminal 4. That is, the first diode 27a is provided so that a current flow from the first internal wiring 23 to the second internal wiring 24, and the second diode 27b is provided so that a current flow from the second internal wiring 24 to the first internal wiring 23. The first diode 27a and the second diode 27b may be formed as parasitic diodes by arranging the ESD protection element 27 between the first internal wiring 23 and the second internal wiring 24.

As a result, even when both the first wire 5a and the second wire 5b are disconnected or when the mounting of the first external terminal 3 is opened outside the semiconductor device 1, a current flows through the first diode 27a to the second external terminal 4 in the first internal wire 23 connected to the first external terminal 3, so that the potential (Va) of the first internal node Na rises by the voltage drop in the first diode 27a, and the detection signal (DTCT) also increases in the positive direction. A disconnection fault of both the first wire 5a and the second wire 5b and an open fault of mounting the first external terminal 3 can be detected by the change in voltages of the detection signals (DTCT).

Further, when the third wire 6 is disconnected or when the mounting of the second external terminal 4 is opened outside the semiconductor device 1, the second internal wiring 24 connected to the second external terminal 4 flows through the second diode 27b to the first external terminal 3, so that the potential (Vb) of the second internal node Nb rises by the voltage drop in the second diode 27b, and the detection signal (DTCT) increases in the negative direction. A disconnection failure of the third wire 6 and an open failure of mounting the second external terminal 4 can be detected by the voltage change of the detection signal (DTCT).

Figure 7:
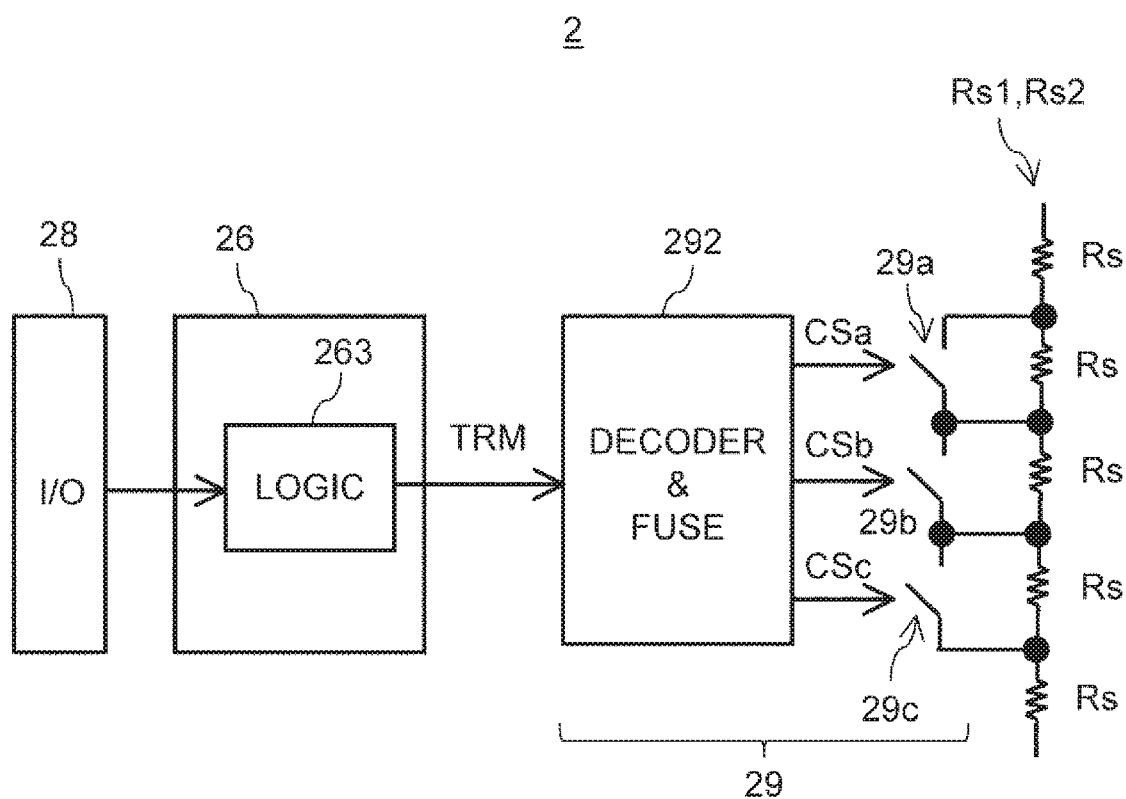
FIG. 7 is a diagram showing a configuration of the trimming circuit.
Figure 8:
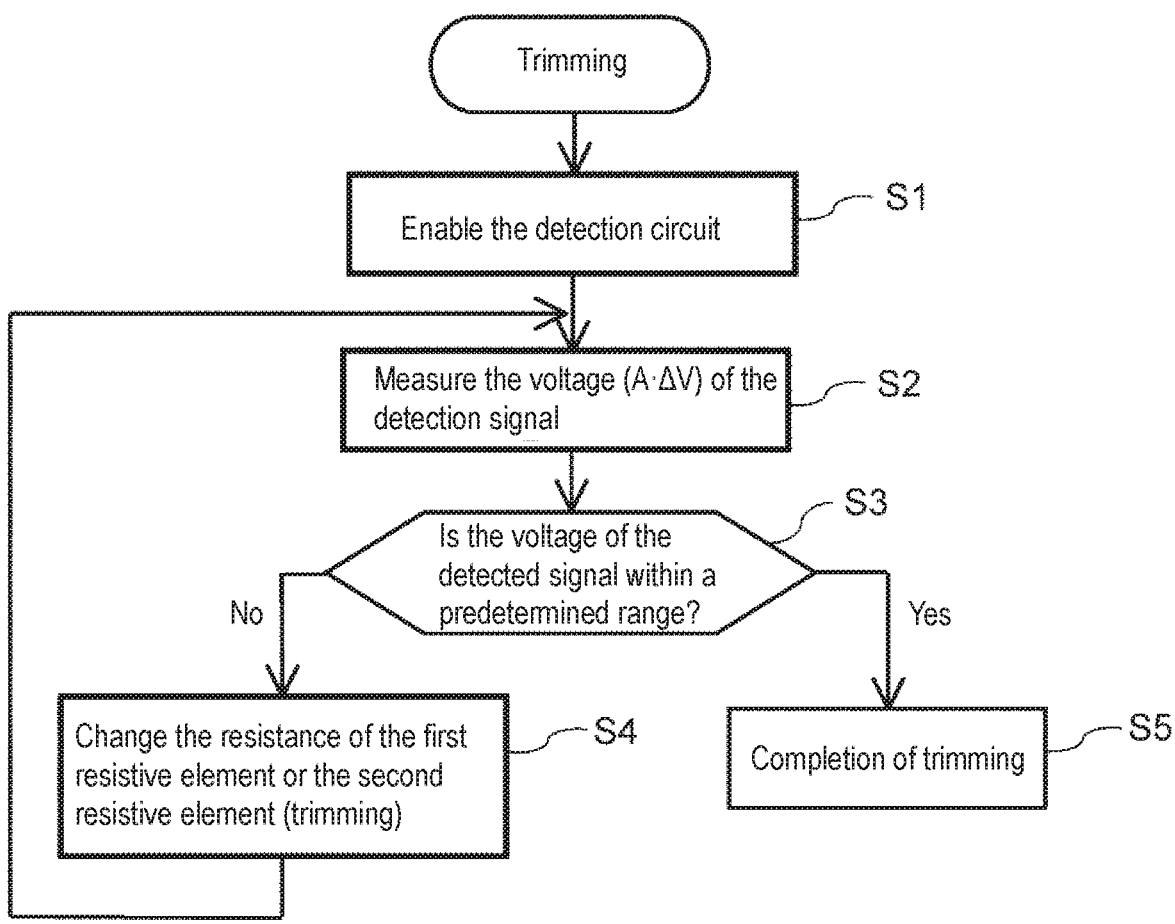
FIG. 8 is a flowchart of trimming.

Next, trimming of the first resistor Rs1 and the second resistor Rs2 will be described with reference to FIGS. 7 and 8. FIG. 7 is a diagram showing a configuration of the trimming circuit. FIG. 8 is a flowchart of trimming.

As shown in FIG. 7, the first resistive element Rs1 and the second resistive element Rs2 are formed by cascading a plurality of resistive elements Rs. The trimming circuit 29 includes switches 29a, 29b, and 29c connected in parallel to the resistive element Rs, and a decoder and fuse circuit 292 for controlling the opening and closing of the switches 29a, 29b, and 29c. The decoder & fuse circuit 292 decodes the trimming signal (TRM) to generate signals (CSa, CSb, CSc) for controlling the opening and closing of the switches 29a, 29b, 29c, and includes an electric fuse for fixing the signals (CSa, CSb, CSc). The logical circuit (LOGIC) 263 of the test mode control circuit 26 generates a trimming signal (TRM) based on a control signal inputted from the MCUs via the I/O interfaces 28. In FIG. 7, five resistance elements Rs and three switches are shown for the sake of clarity, but the present invention is not limited to this, and it is needless to say that the number of resistance elements Rs and switches may be changed in accordance with the trimming accuracy.

With the above configuration, the first resistive element Rs1 and the second resistive element Rs2 can be trimmed. The first resistive element Rs1 and the second resistive element Rs2 are trimmed in the pre-shipment operation checking process of the semiconductor device 1. This trimming method will be described with reference to FIG. 8.

A semiconductor test apparatus (tester) (not shown) sets the test mode control circuit 26 of the semiconductor device 1 to the test mode, and the test mode control circuit 26 enables the detection circuit 25 (step S1). The tester measures the voltages (A·ΔV) of the detection signals (DTCT) output from the output pads 30 (step S2). The tester determines whether the voltage (A·ΔV) of the detection signal (DTCT) is within a predetermined range (e.g., 0±0.1 V) (step S3). If NO, the tester sends a control signal based on the voltage (A·ΔV) to the test-mode control circuit 26, and the trimming circuit 29 opens and closes the switches 29a, 29b, and 29c to change the resistance of the first resistive element Rs1 or the second resistive element Rs2 (step S4), and the process returns to step S2. In the case of YES, the electric fuse is cut off, the switches 29a, 29b, and 29c are opened and closed, fixed, and trimming is finished in step (S5).

Although an example has been described in which the first resistive element Rs1 or the second resistive element Rs2 is trimmed so that the two input voltage differences (ΔV) of the amplification circuit 252 become a predetermined value (e.g., zero) in a normal state, the predetermined value of the input voltage difference (ΔV) is not limited to 0 V, and may be, for example, 1 V or −1 V.

Also, although the present embodiment illustrates a configuration in which two of the first wire 5a and the second wire 5b are connected to the first external terminal 3, three or more wires may be used because the change in impedance is used to detect wire breakage from the change in voltage.

According to the configuration of the embodiment, it is possible to detect not only a case where an open failure due to disconnection occurs in any of the paths related to the first external terminal 3 and the second external terminal 4, but also a case where any one of the wires is disconnected in the first external terminal 3 having two or more wires (for example, the first wire 5a and the second wire 5b).

In addition, in the configuration of the embodiment, since the first resistive element Rs1 and the second resistive element Rs2 can be trimmed, the input-voltage difference (ΔV) of the amplification circuit 252 in the initial state can be adjusted to an arbitrary value (e.g., zero-volt) in the initial state, so that the change in the detected amount thereafter can be easily grasped.

In the semiconductor device of the embodiment, it is possible to check whether or not the wire of the ground terminal (the first external terminal 3 or the second external terminal 4) is disconnected at an arbitrary timing to diagnose a failure. It is possible to prevent a fatal loss of function such as a runaway from the functional effect in the case of an open failure in any one of two or more ground terminals.

Variation

Hereinafter, some representative variations of the embodiment will be exemplified. In the following description of the modified example, the same reference numerals as those in the above-described embodiment may be used for portions having the same structures and functions as those described in the above-described embodiment. In the description of such portions, the description in the above-described embodiment can be appropriately incorporated within a range not contradictory in the art. In addition, some of the above-described embodiments and all or some of a plurality of variations may be applied in combination as appropriate within a range not inconsistent in the art.

First Modification

Figure 9:
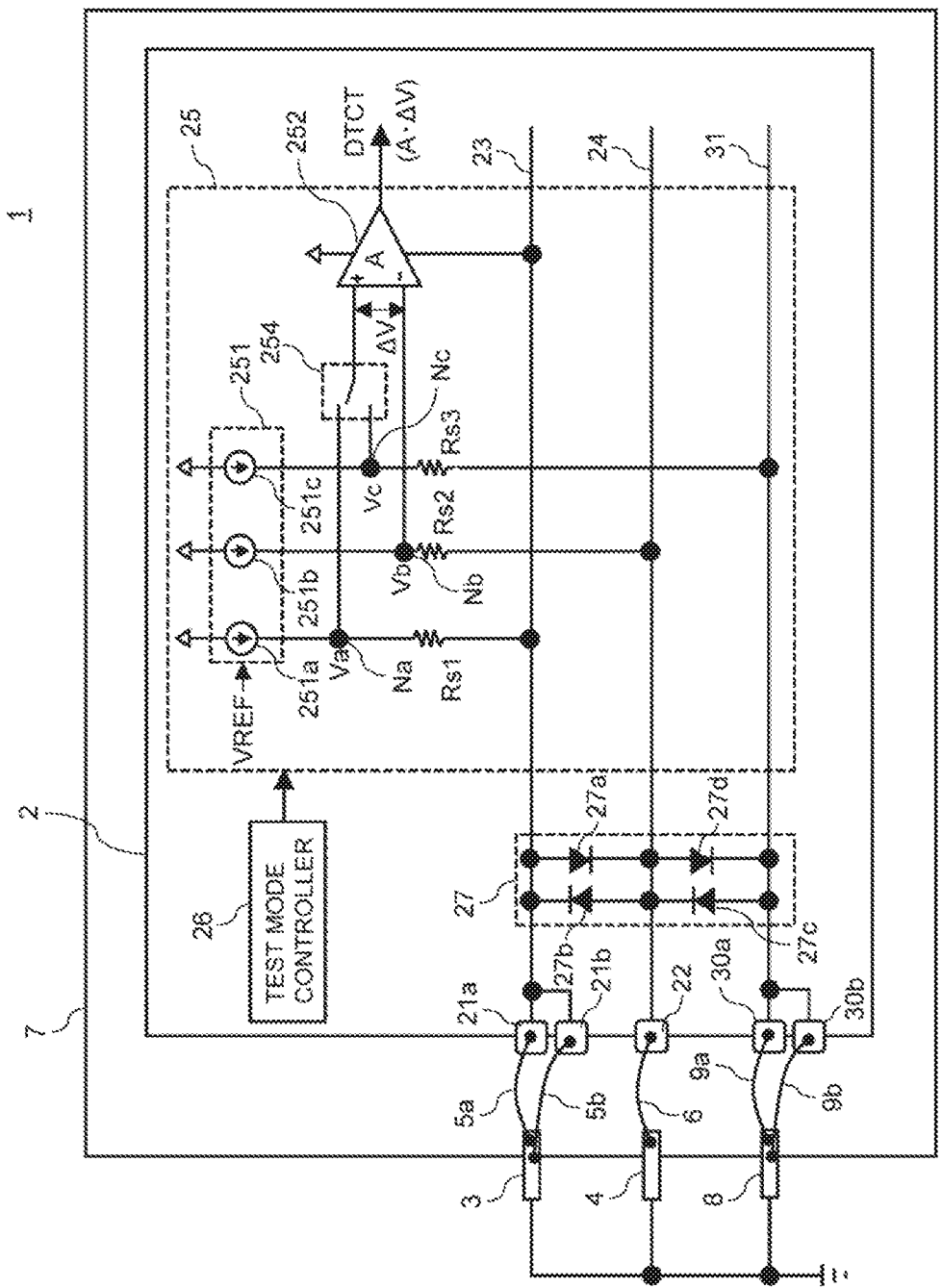
FIG. 9 is a diagram showing a configuration of a semiconductor device according to a first modification.

FIG. 9 is a diagram showing a configuration of a semiconductor device according to a first modification.

In the first modification, the fourth wire 9a and the fifth wire 9b of the third external terminal 8 are further added to the semiconductor device of the embodiment shown in FIG. 2. Accordingly, the semiconductor chip 2 further includes a fourth pad 30a connected to the third external terminal 8 by the fourth wire 9a, a fifth pad 30b connected to the third external terminal 8 by the fifth wire 9b, and a third inner wire 31 connected to the fourth pad 30a and the fifth pad 30b. The semiconductor chip 2 further includes a third diode 27c connected so as to flow a current from the third internal wiring 31 to the second internal wiring 24, and a fourth diode 27d connected so as to flow a current from the second internal wiring 24 to the third internal wiring 31. The detection circuit 25 further includes a third current source 251c for causing a current to flow through the third inner wiring 31, a third resistive element Rs3 connected to the third current source 251c, and a selection switch 254. The selection switch 254 selects one of the potentials (Va) of the first internal node Na and the potential (Vc) of the third internal node Nc under the control of the test mode control circuit 26, and inputs the selected potential to the amplifier circuit 252.

It should be noted that while the embodiment has only one external terminal for grounding having two wires, the first modification corresponds to the case where there are two external terminals for grounding similar to the embodiment. The number of external terminals for grounding to which two wires are connected is not limited to two, and may be three or more.

In the first modification, there are two external terminals for grounding to which two wires are connected. In the test mode, the potential (Va) of the first internal node Na or the potential (Vc) of the third internal node Nc on the side where the presence or absence of wire disconnection is to be detected is selected by the selection switch 254 and input to the amplifier circuit 252.

According to the first modification, in addition to the effect of the embodiment, even when there is a plurality of external terminals for grounding that are desired to be diagnosed, it is possible to selectively diagnose the presence or absence of a disconnection fault with a small circuit configuration. In particular, in a semiconductor device having a plurality of driver channels, since there are many cases in which external terminals for grounding are provided for each channel, disconnection diagnosis of each external terminal for grounding can be performed with a small number of circuit configurations.

Second Modification

Figure 10:
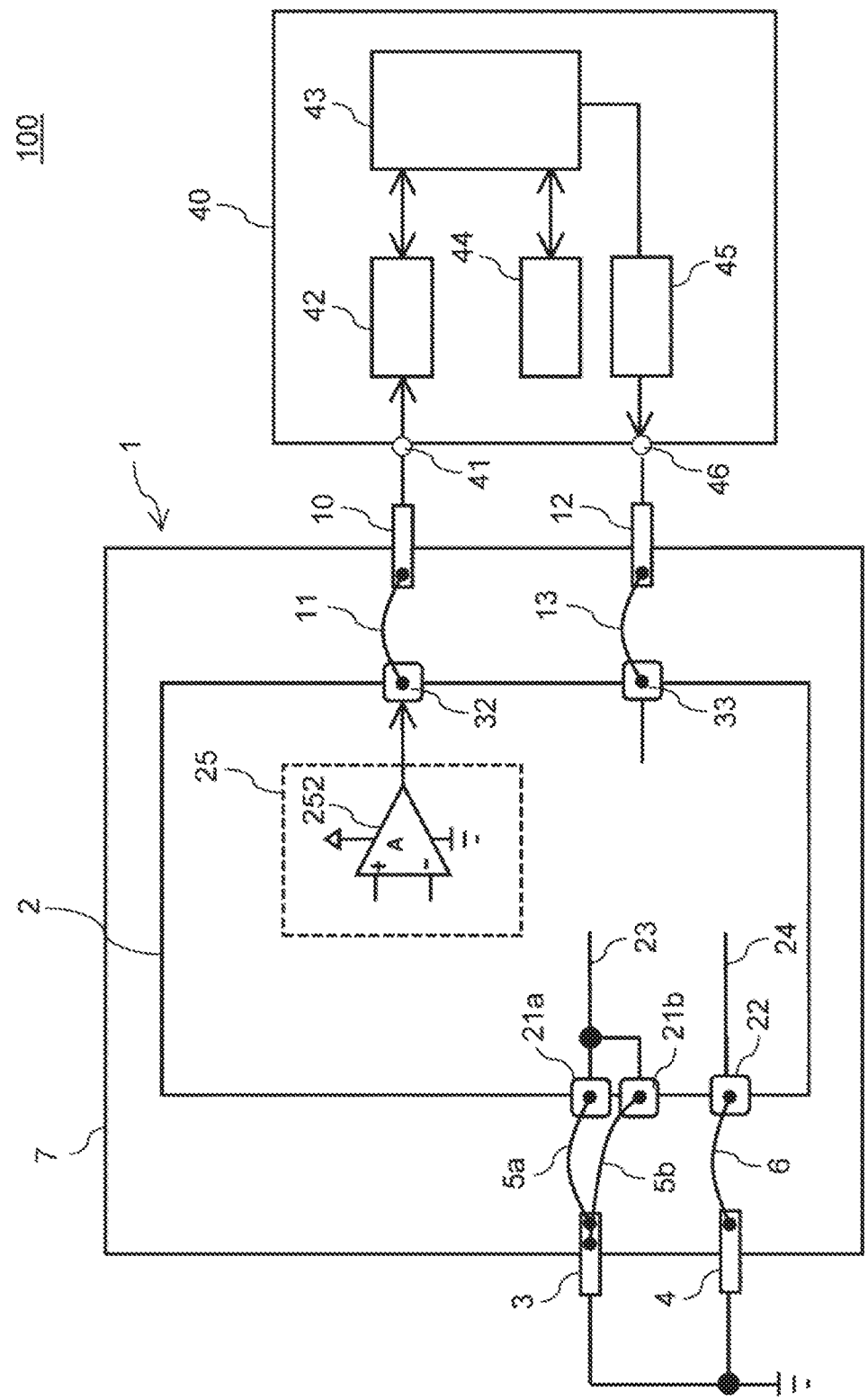
FIG. 10 is a diagram showing a configuration of an electronic circuit according to a second modification.

FIG. 10 is a diagram showing a configuration of an electronic circuit according to a second modification.

The electronic circuit 100 according to the second modification includes a semiconductor device 1 and a MCU40. In the second modification, the semiconductor device 1 of the embodiment (FIG. 2) further includes an output terminal 10 for sending out the detection signal (DTCT) to the outside, an output pad 32 to which the output of the amplification circuit 252 is connected, a wire 11 for connecting the output terminal 10 and the output pad 30, an input terminal 12, an input pad 33, and a wire 13 for connecting the input terminal 12 and the input pad 33.

The MCU40 includes an input terminal 41 to which the output terminal 10 is connected, an A/D converter 42 for converting a detection signal (DTCT) into a digital signal, a CPU43 (arithmetic processing circuit), a flash memory 44, an I/O interface 45 such as a serial interface, and an output terminal 46 to which the input terminal 12 is connected. Software programs for controlling the operation of the CPU43 are written in, for example, the flash memory 44.

Figure 11:
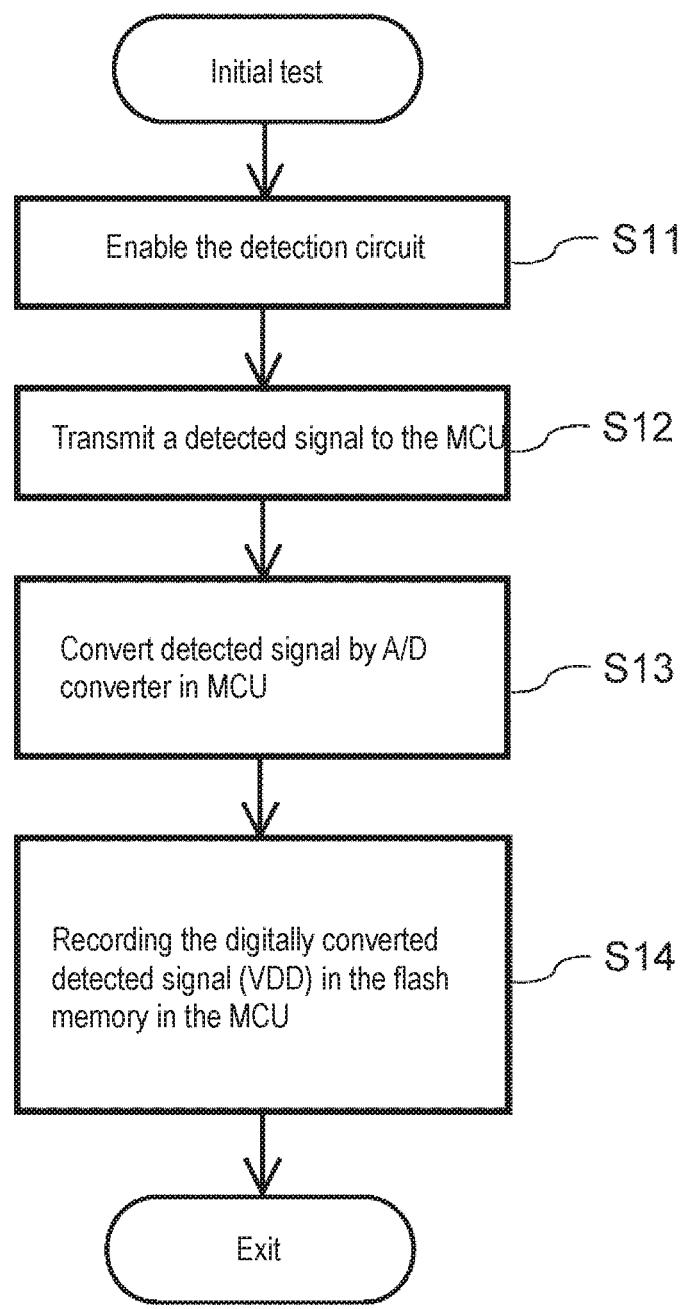
FIG. 11 is a flowchart showing an initial test processing operation of the electronic circuit of FIG. 10.

Next, an initial inspection of the semiconductor device 1 incorporated in the electronic circuit 100 will be described with reference to FIG. 11. FIG. 11 is a flowchart showing an initial inspection processing operation in the electronic circuit of FIG. 10.

In order to record the initial value of the test of the semiconductor device 1 incorporated in the electronic circuit 100 in the MCU40, the semiconductor device 1 sets the test mode control circuit 26 to the test mode and enables the detection circuit 25 in step (S11). The semiconductor device 1 transmits a detection signal (DTCT) as an analog voltage to an external MCU40 via the output pads 30, the wires 11, and the output terminals 10 (S12). The MCU40 converts the detection signal (DTCT) input from the input terminal 41 into a digital signal by the A/D converter 42 (S13). In step (S14), the MCU40 records the detection signal converted into the digital signal in the flash memory 44 using the CPU43. Initial values of the test signals recorded in the flash memory 44 are defined as VD0.

Figure 12:
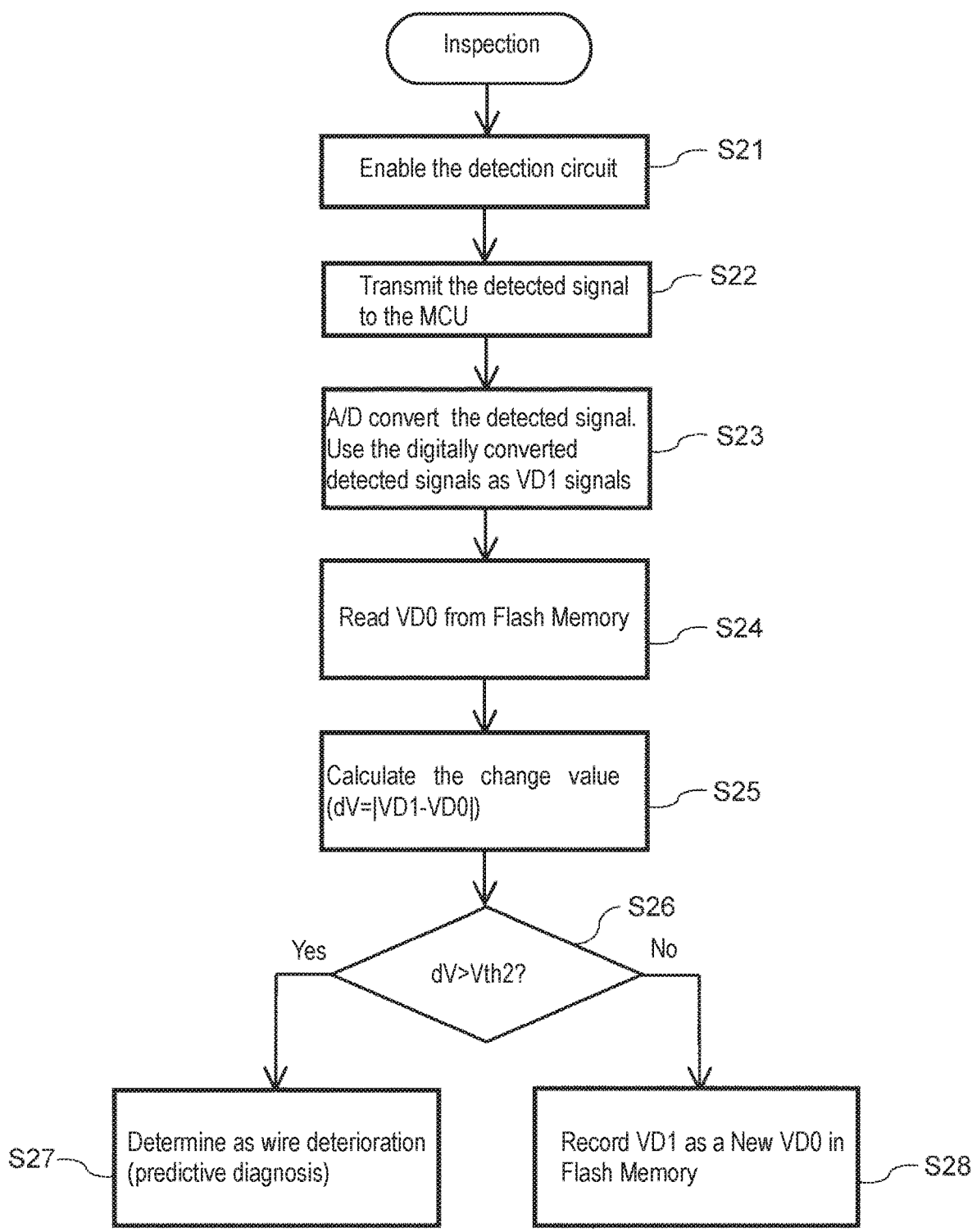
FIG. 12 is a flowchart showing the second and subsequent inspection processing operations of the electronic circuit of FIG. 10.

Next, a case where the semiconductor device 1 of the electronic circuit 100 is used and an inspection is performed after an arbitrary time has elapsed (for example, after a predetermined time has elapsed) (the second and subsequent inspections) will be described with reference to FIG. 12. FIG. 12 is a flowchart showing the second and subsequent inspection processing operations of the electronic circuit of FIG. 10.

In step S21, the semiconductor device 1 sets the test mode control circuit 26 to the inspection mode in the same manner as in step S11, and enables the detection circuit 25. Similarly to step S12, the semiconductor device 1 transmits a detection signal (DTCT), which is an analog voltage, to an external MCU40 (step S22). The MCU40 converts the detection signal (DTCT) inputted in the same manner as in step S13 into a digital signal by the A/D converter 42 (step S23). Here, the value of the test signal converted into the digital signal is referred to as V1.

At the CPU43 in the MCU40, the value (VD0) of the previous detected signal is read from the flash memory 44 (step S24), and the change amount (dV=|VD1−VD0|) is calculated from the VD1 digitally converted at step S23 and V0 read at step S24 (step S25). Next, in CPU43, the predetermined threshold (Vth2) and the amount of change (dV) are compared (Step S26), and when the dV exceeds the Vth2 (YES), the wire of the first wire 5a of the semiconductor device 1 is deemed to have deteriorated and the impedance has increased, and is determined to be abnormal (Step S27). This is a predictive diagnosis for detecting signs of wire breakage. However, it is also possible to detect the case where the wire is disconnected. It should be noted that the predetermined threshold (Vth2) is arbitrarily set by the user from the viewpoint of time degradation factors such as oxidation of the wire such as the first wire 5a, oxidation of the contact surface between the wire and the pad such as the first pad 21a of the semiconductor chip 2, and degeneration of the contact area between the wire and the pad due to external stress.

When the CPU43 determines that the semiconductor device 1 is abnormal in the predictive diagnosis in step S27, the CPU43 transmits a control signal from the output terminal 46 to the semiconductor device 1. The control signal may, for example, cause the test mode control circuit 26 to disable the operation of the semiconductor chip 2 and shut down the semiconductor device 1, or cause the test mode control circuit 26 to shift the semiconductor chip 2 to a mode of low power consumption or to a mode of limiting the operation for safe operation (e.g., to suppress or shut down the function only for circuitry with high current flow).

If NO in step S26, the VD1 is recorded (overwritten) as a new VD0 in the flash memory 44 (step S28). The newly recorded VD0 is used as a reference for performing a comparative operation according to the flow of FIG. 8 at the next examination.

According to the second modification, not only the presence or absence of wire disconnection is judged to be 0 or 1, but also the change of the detection signal, that is, the change of the wire resistance, can be monitored by comparing with the value of the previous detection signal stored in the flash memory. That is, it is possible to predict and diagnose the possibility of wire breakage by not only the existence or non-existence of wire breakage but also arithmetic processing in the microcontroller.

While the invention made by the inventor has been specifically described based on the embodiments, examples, and variations, it is needless to say that the present invention is not limited to the above-described embodiments, examples, and variations, and various modifications are possible.

For example, in the embodiment, the semiconductor chip 2 is mounted on the die pad of the lead frame, but the semiconductor chip 2 may be mounted on the wiring substrate, the wires may be connected to the terminals on the front surface of the wiring substrate, the surfaces of the semiconductor chip 2, the wires, and the wiring substrate may be sealed, and the terminals on the back surface of the wiring substrate may be exposed to the outside of the sealing body.

In the embodiment, an example of providing a comparator 253 in the detection circuit 25 has been described, but is not limited thereto, and may be provided, for example, in the test mode control circuit 26.

In the embodiment, an example of providing the register 262 in the test mode control circuit 26 has been described, but is not limited thereto, and may be provided, for example, in the detection circuit 25.

In the embodiment, an example in which the LOGIC 263 is provided in the test mode control circuit 26 has been described, but the present invention is not limited thereto, and may be provided in the detection circuit 25, for example.

In the second modification, an example in which the predictive diagnosis of the wire disconnection is performed by the MCU has been described, but the predictive diagnosis of the wire disconnection may be performed by the semiconductor device 1 by providing the A/D converter, the CPU, and the flash memory in the semiconductor device 1.

In the second modification, the disconnection prediction is performed by the difference between the value (VD1) of the new detection signal and the value (VD0) of the previous detection signal, and the VD1 is stored as a new VD0 in the flash memory 44, but the value of the first detection signal may be stored in the flash memory 44 as VD0, the value of the second detection signal as VD1, and the value of the n-th detection signal as VDn−1, respectively, and the predictive diagnosis may be performed by the increasing tendency of the value of the detection signal.

What is claimed is:

1. A semiconductor device comprising:
a semiconductor chip having first, second and third pads,
a first and a second external terminals to which a power supply potential or a reference potential is supplied,
a first and a second wire connecting the first external terminal and the first and second pads,
a third wire connecting the second external terminal and the third pad,
a first internal wiring connected to the first and second pads,
a second internal wiring connected to the third pad, and the detection circuit,
the detection circuit, having
a current source for supplying a current to the first and second internal wirings, and
an amplifying circuit for amplifying a relative potential difference generated in the first and second internal wiring and outputting a detection signal.

2. The semiconductor device according to claim 1,
the semiconductor chip further comprising a first and a second resistive elements connected between the current source and the first and second internal wiring, and
an amplifying circuit for amplifying a relative potential difference generated in the first and second resistive elements and outputting a detection signal.

3. The semiconductor device according to claim 1,
the semiconductor chip further comprising a test mode control circuit that enables the operation of the detection circuit only during testing,
wherein the current source generates a current based on a reference voltage, and includes a first current mirror current source for causing a current to flow in the first internal wiring, and a second current mirror current source for causing a current to flow in the second internal wiring.

4. The semiconductor device according to claim 2,
wherein the first and second resistive elements are trimmable resistive elements.

5. The semiconductor device according to claim 1,
further comprising a first and a second diodes connected between the first internal wiring and the second internal wiring,
wherein the first diode and the second diode are connected so as a direction of conduction of the first diode and a direction of conduction of the second diode to be opposite to each other.

6. The semiconductor device according to claim 3,
further comprising a third external terminal, and
a fourth and a fifth wires connected to the third external terminal,
wherein the semiconductor chip further comprises,
a fourth pad to which the fourth wire is connected,
a fifth pad to which the fifth wire is connected, and
a third internal wiring connected to the fourth and fifth pads,
wherein the detection circuit further comprises,
a third current mirror current source for supplying a current to the third internal wiring,
a third resistive element connected between the third current mirror current source and the third internal wiring,
a selection switch for selecting a first connection node between the first current mirror current source and the first resistive element, and a third connection node between the third current mirror current source and the third resistive element and inputting the selected connection node to the amplifier circuit.

7. An electronic circuit comprising a first semiconductor device and a second semiconductor device,
the first semiconductor device comprising,
a semiconductor chip having first, second and third pads, first internal wiring connected to the first and second pads, second internal wiring connected to the third pads, and a detection circuit,
a first and a second external terminals to which a power supply potential or a reference potential is supplied,
a first and a second wire connecting the first external terminal and the first and second pads, and
a third wire connecting the second external terminal and the third pad,
the detection circuit comprising,
a current source for supplying a current to the first and second internal wirings, and
an amplifying circuit for amplifying a relative potential difference generated in the first and second internal wiring and outputting a detection signal, the second semiconductor device comprising,
an analog/digital converter for converting a detection signal output from the first semiconductor device into a digital signal and outputting the digital signal,
an arithmetic processing circuit for calculating a digital signal output from the analog/digital converter, and
a memory circuit controlled by the arithmetic processing circuit for recording the digital signal,
wherein the arithmetic processing circuit calculates a difference between the digital signal output from the analog/digital converter and a second digital signal recorded in the memory circuit, and outputs a control signal to the first semiconductor device when the difference exceeds a predetermined threshold.

8. The semiconductor device according to claim 7,
the semiconductor chip further comprising a first and a second resistive elements connected between the current source and the first and second internal wiring, and
an amplifying circuit for amplifying a relative potential difference generated in the first and second resistive elements and outputting a detection signal.

9. The electronic circuit according to claim 7,
the semiconductor chip further comprising a test mode control circuit that enables the operation of the detection circuit only during testing,
wherein the current source generates a current based on a reference voltage, and includes a first current mirror current source for causing a current to flow in the first internal wiring, and a second current mirror current source for causing a current to flow in the second internal wiring.

10. The electronic circuit according to claim 8,
wherein the first and second resistive elements are trimmable resistive elements.

11. The electronic circuit according to claim 7,
the semiconductor chip further comprising a first and a second diodes connected between the first internal wiring and the second internal wiring,
wherein the first diode and the second diode are connected so as a direction of conduction of the first diode and a direction of conduction of the second diode to be opposite to each other.

12. The electronic circuit according to claim 9,
the first semiconductor device further comprising
a third external terminal, and
a fourth and a fifth wires connected to the third external terminal,
wherein the semiconductor chip further comprises,
a fourth pad to which the fourth wire is connected,
a fifth pad to which the fifth wire is connected, and
a third internal wiring connected to the fourth and fifth pads,
wherein the detection circuit further comprises,
a third current mirror current source for supplying a current to the third internal wiring,
a third resistive element connected between the third current mirror current source and the third internal wiring,
a selection switch for selecting a first connection node between the first current mirror current source and the first resistive element, and a third connection node between the third current mirror current source and the third resistive element and inputting the selected connection node to the amplifier circuit.

13. A method for inspecting a semiconductor device, comprising: a semiconductor chip having first, second, and third pads; a first internal wiring connected to the first and second pads; and a second internal wiring connected to the third pad; first and second external terminals to which a power supply potential or a reference potential is supplied; first and second wires connecting the first external terminal and the first and second pads; and a third wire connecting the second external terminal and the third pad,
wherein the method of inspecting the semiconductor device including steps of,
passing a current through the first internal wiring,
passing a current through the second internal wiring, and
amplifying a relative potential difference generated between the first and second internal wiring to output a detection signal.

14. The method of inspecting a semiconductor device according to claim 13,
wherein the step of passing a current through the first internal wiring includes passing through a first resistive element connected between the current source and the first internal wiring,
the step of passing a current through the second internal wiring includes passing through a second resistive element connected between the current source and the second internal wiring, and
the step of amplifying a relative potential difference is generating between the first and second resistive elements to output a detection signal.

15. The method of inspecting a semiconductor device according to claim 14,
further including steps of,
obtaining a digitally converted VD0 of the detected signals,
recording the VD0,
wherein the steps of passing a current through the first internal wiring and the first resistive element to recording the VD0 are a method of inspecting a semiconductor device after the semiconductor device is incorporated in a system.

16. The method of inspecting a semiconductor device according to claim 15,
further including steps of,
passing a current through the first internal wiring and the first resistive element,
passing a current through the second internal wiring and the second resistive element,
amplifying a relative potential difference generated between the first and second resistive elements to output a detection signal,
obtaining a digital-converted VD1 of the detected signals outputted in step of amplifying a relative potential difference generated between the first and second resistive elements to output a detection signal,
if the difference between the VD0 and the VD1 exceeds a predetermined value, the wire degradation is determined, and
if the difference between the VD0 and the VD1 does not exceed a predetermined value, the VD1 is stored in the memory,
wherein the steps of passing a current through the first internal wiring and the first resistive element to obtaining a digital-converted VD1 of the detected signals outputted in step of amplifying a relative potential difference generated between the first and second resistive elements to output a detection signal are performed after a predetermined period of time has elapsed since the steps of passing a current through the first internal wiring and the first resistive element to recording the VD0 are performed.

17. The method of inspecting a semiconductor device according to claim 16,
further including step of,
stopping the semiconductor device, shifting the semiconductor device to a low power consumption mode, or shifting the semiconductor device to a mode for limiting a functional operation for a safe operation after the step of the wire degradation is determined, If the difference between the VD0 and the VD1 exceeds a predetermined value.

* * * * *